（12) United States Patent
Kanazawa et al.

(10) Patent No.: US 6,548,916 B1
(45) Date of Patent: Apr. 15, 2003

(54) POWER SUPPLY SYSTEM AND POWER SUPPLY METHOD

(75) Inventors: Akiyoshi Kanazawa, Shizuoka-ken (JP); Makoto Uda, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/513,331

(22) Filed: Feb. 25, 2000

(30) Foreign Application Priority Data

Mar. 4, 1999 (JP) .............................................. 11-57623

(51) Int. Cl.[7] .............................................. H03K 17/00
(52) U.S. Cl. ........................ 307/85; 307/10.1; 307/10.7
(58) Field of Search ................................. 307/9.1, 10.1, 307/10.7, 75, 85–87

(56) References Cited

U.S. PATENT DOCUMENTS 5,455,463 A * 10/1995 Langnickel et al. ........ 307/10.7
5,488,283 A * 1/1996 Dougherty et al. ......... 307/10.7
5,549,984 A * 8/1996 Dougherty .................. 307/10.7
6,060,789 A * 5/2000 Yamaguchi .................. 307/86

* cited by examiner

*Primary Examiner*—Fritz Fleming
(74) *Attorney, Agent, or Firm*—Finnegan, Henderson, Farabow, Garrett & Dunner, L.L.P.

(57) ABSTRACT

When a voltage larger than a voltage from a 12-V power supply (11) and capable of on/off controlling an n-channel MOSFET (15) is supplied to a simple ON/OFF circuit (19), the simple ON/OFF circuit (19) outputs to the gate G a control signal that on/off controls the n-channel MOSFET (15) by the supplied voltage, thereby performing on/off control of the n-channel MOSFET (15), and enabling control of electrical power supplied to a load (13) from the 12-V power supply (11). The 36-V power supply (17) is used for on/off control of the n-channel MOSFET (15), so as to supply the output voltage from the 12-V power supply (11) to the load (13).

27 Claims, 7 Drawing Sheets

POWER SUPPLY SYSTEM AND POWER SUPPLY METHOD

BACKGROUND OF THE INVENTION

1. Field of the Invention

The present invention relates to a power supply system and a power supply method, and particularly to a power supply system in which a semiconductor switch is provided for controlling supply of electrical power from a power supply to a load and driven in response to a drive signal, and a power supply method for controlling the supply of electrical power from a power supply to a load. More specifically, the invention relates to a power supply system and a power supply method for a vehicle.

2. Description of the Related Art

A semiconductor switch used in this type of power supply system is, for example, an n-channel MOSFET (metal oxide semiconductor field-effect transistor). Because of the extremely low on-resistance and low cost of this n-channel MOSFET, it has come to be used in automotive applications.

FIG. 7 shows such a type of power supply system in a vehicle, in which an output voltage from a 12-V power supply 101 is supplied to a load 103 via the drain D and the source S of an n-channel MOSFET 105, which is a semiconductor switch to be driven for switching.

For use to the drive, an output voltage from the 12-V power supply 101 is supplied via an ON/OFF circuit 107, where it is switched to be on and off, to a charge pump circuit 109 which is composed of a voltage stepup circuit 111 and an oscillator circuit 113. The circuit 111 steps up the supplied voltage, and a stepped-up voltage is input to the circuit 113, where it is based on to generate an oscillating raised voltage of a prescribed frequency, which is output as a control signal to the gate of the n-channel MOSFET 105, which is thereby driven to switch on and off, supplying electrical power from the 12-V power supply 101 to the load 103.

As such, in automotive applications, the n-channel MOSFET is often switched on and off at the high side (upstream of a load), where it thus has a gate-source voltage normally raised above an on-voltage, with the need for provision of a charge pump circuit.

Although the power supply system has the advantages of low cost and a low on-resistance, in applications such as use in a vehicle, it requires such extra elements as a charge pump circuit. One example of such application s in an intelligent power system (IPS) that has an n-channel MOSFET with a built-in charge pump circuit and protection circuit, and is expensive.

In addition, the charge pump circuit has an oscillator circuit, which is caused to oscillate at a high frequency (several hundreds of kilohertz) in order to achieve a reduction in size of the power supply system in vehicle. For this reason, there is an increased chance of the oscillator generating noises in the radio of vehicle. This necessitates a circuit to reduce such radio noises, thereby increasing the cost of the power supply system.

While a p-channel MOSFET can also be used on the high side, this p-channel MOSFET has a larger chip than the n-channel MOSFET, and has a higher cost than the n-channel MOSFET to achieve the same performance.

FIG. 8 shows a multiple-voltage power supply system that has not actually been used in a vehicle.

In this power supply system, a voltage (42 V) generated by an alternator 121 is charged to a 36-V battery B1 via a diode D1, and electrical power of the 36-V battery B1 is supplied to a load 123, such as a drive motor. The voltage (42 V) generated by the alternator 121 is also converted to 14 V by a DC/DC converter 125 and supplied to a 12-V battery B2, and electrical power from the 12-V battery B2 is supplied to another load 127, such as a lamp.

By use of a DC/DC converter for conversion from 42 V to 14 V, there is achieved a multiple-voltage system encompassing a battery for 36-V system and a battery for 12-V system, enabling supply of electrical power to both a high-voltage load such as a drive motor and a low-voltage load such as a lamp. The voltage of the 36-V battery is a triple of that of the 12-V battery B2, and the supply current of the former is one-third of that of the latter for the same electrical power, enabling the cross-section of conductors in wiring harness associated with the 36-V battery to be made approximately one-third of that of conductors wiring harness associated with the 12-V battery, thereby not only reducing the weight of wire harness, but also improving the load efficiency.

SUMMARY OF THE INVENTION

Accordingly, it is an object of the present invention to provide a power supply system and a power supply method that use multiple voltages permitting a simple, low-cost circuit configuration to provide easy on/off control of a load.

The present invention adopts the following configuration in order to achieve the above-noted object.

Specifically, one aspect of the present invention is a power supply system comprising a first power supply having a first supply voltage, a second power supply having a second supply voltage larger than the first supply voltage, a semiconductor switch drivable with the second supply voltage and connected between the first power supply and a load, and a drive circuit using the second supply voltage as a drive signal to drive the semiconductor switch.

According to this aspect, a multi-voltage power supply system allows a semiconductor switch to be driven with a simple, low-cost configuration, for effective supply of power to a load.

Another aspect of the present invention is a power supply system for a vehicle including a load, the power supply system, comprising a first power supply having a first supply voltage, a second power supply having a second supply voltage larger than the first supply voltage, a semiconductor switch drivable with the second supply voltage and connected between the first power supply and the load, and a drive circuit using the second supply voltage as a first drive signal to drive the semiconductor switch.

According to this aspect, in a vehicle having a load, a multi-voltage power supply system allows a semiconductor switch to be driven with a simple, low-cost configuration, for effective supply of power to the load.

Another aspect of the present invention is a power supply system for a vehicle including a motor having first and second electrodes different of polarity, and grounding circuitry, the power supply system comprising a first power supply having a first supply voltage, a second power supply having a second supply voltage larger than the first supply voltage, a first semiconductor switch connected between the first power supply and the first electrode of the motor, a second semiconductor switch connected between the first power supply and the second electrode of the motor, a third semiconductor switch drivable with the second supply voltage and connected between the second electrode of the motor and the grounding circuitry, a fourth semiconductor switch drivable with the second supply voltage and connected between the first electrode of the motor and the grounding circuitry, a first drive circuit configured to drive the first semiconductor switch, a second drive circuit configured to drive the second semiconductor switch, a third drive circuit using the second supply voltage as a drive signal to drive the third semiconductor switch, a fourth drive circuit using the second supply voltage as a drive signal to drive the fourth semiconductor switch, and a controller configured to synchronously control the first, second, third and fourth drive circuits to control a rotating direction of the motor.

According to this aspect, in a vehicle including a motor and grounding circuitry, a multi-voltage power supply system allows a set of semiconductor switches to be synchronously driven with a simple, low-cost configuration, for effective supply of power to the motor.

Another aspect of the present invention is a power supply system which performs on/off control of a semiconductor switch so as to control the supply of electrical power from a first power supply to a load. This power supply system has a second power supply with a second voltage that is larger than a first voltage of the first power supply and that can perform on/off control of the semiconductor switch, and driving means that outputs to a control input terminal of the semiconductor switch a control signal for performing on/off control of the semiconductor switch by means of the second voltage supplied from the second power supply.

According to this aspect of the present invention, when the second voltage that is larger than the first voltage of the first power supply and that is capable of on/off controlling the semiconductor switch is supplied to the control means from the second power supply, the driving means outputs to the control input of the semiconductor switch a control signal for on/off controlling the semiconductor switch by the second voltage. This results in on/off control of the semiconductor switch, and control of the supply of electrical power to the load from the first power supply. More specifically, by using the second power supply to perform on/off control of the semiconductor switch and supplying electrical power to the load from the first power supply so as to control the supply of electrical power thereto, it is extremely easy to perform on/off control of the load, without the need for a complex charge pump circuit as was used in the past, using a simple, low-cost circuit.

Another aspect of the present invention is a power supply system comprising a first semiconductor switch connected to a first power supply and to a first end of a motor, a second semiconductor switch connected to a second end of the motor and to ground, a third semiconductor switch connected to the first power supply and to the second end of the motor, a fourth semiconductor switch connected to the first end of the motor and to ground, a second power supply having a second voltage, larger than a first voltage of the first power supply and capable of on/off controlling the first and third semiconductor switches, a first driver outputting to a control input terminal of the first semiconductor switch a signal for performing on/off control of the first semiconductor switch by means of the second voltage, a second driver performing on/off control of the second semiconductor switch linked to on/off control of the first semiconductor switch, a third driver outputting to a control input terminal of the third semiconductor switch a signal for performing on/off control of the third semiconductor switch by means of the second voltage, and a fourth driver performing on/off control of the fourth semiconductor switch linked to on/off control of the third semiconductor switch.

According to this aspect, it is possible to achieve a power supply system which facilitates the forward/reverse drive of a motor, with a simple, low-cost circuit configuration, and without the need for a charge pump circuit.

Another aspect of the present invention is a power supply method comprising providing a first power supply having a first supply voltage, providing a second supply voltage larger than the first supply voltage, connecting a semiconductor switch between the first power supply and a load, the semiconductor switch being drivable with the second supply voltage, and using the second supply voltage as a drive signal to drive the semiconductor switch.

According to this aspect also, a multi-voltage power supply system allows a semiconductor switch to be driven in a simple, low-cost manner, for effective supply of power to a load.

Another aspect of the present invention is a power supply method for a vehicle including a load, the power supply method comprising providing a first power supply having a first supply voltage, providing a second supply voltage larger than the first supply voltage, connecting a semiconductor switch between the first power supply and the load, the semiconductor switch being drivable with the second supply voltage, and using the second supply voltage as a drive signal to drive the semiconductor switch.

According to this aspect also, in a vehicle having a load, a multi-voltage power supply system allows a semiconductor switch to be driven in a simple, low-cost manner, for effective supply of power to the load.

Another aspect of the present invention is a method for supplying electrical power from a first power supply to a load by performing on/off control of a semiconductor switch provided in the power supply system. This method has a step of supplying to the driving means from the second power supply a second voltage, which is larger than the first voltage from the first power supply and which is capable of on/off controlling the semiconductor switch, and a step of outputting to a control input terminal of the semiconductor switch a control signal for on/off controlling the semiconductor switch by means of the second voltage supplied to the driving means from the second power supply, thereby enabling control of the supply of electrical power from the first power supply by performing on/off control of the semiconductor switch.

That is, by using the second power supply to perform on/off control of the semiconductor switch, and also by controlling the supply of electrical power to the load by supplying electrical power thereto from the first power supply, it is extremely easy to perform on/off control of the load, without the need for a complex charge pump circuit as was used in the past, using a simple, low-cost circuit.

BRIEF DESCRIPTION OF THE DRAWINGS

The above and further objects and novel features of the present invention will more fully appear from the following detailed description when the same is read in conjunction with the accompanying drawings, in which.

DESCRIPTION OF THE PREFERRED EMBODIMENTS

Figure 1:
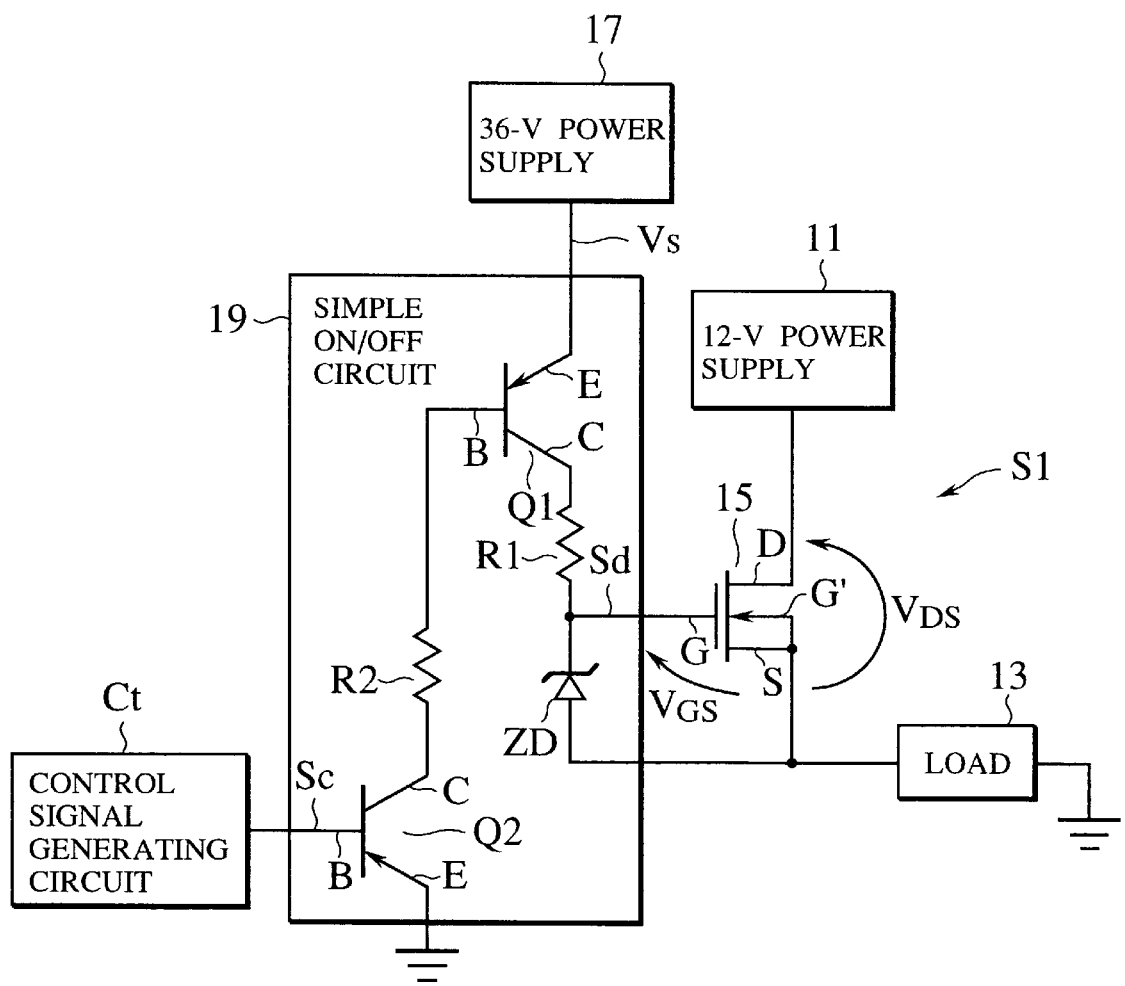
FIG. 1 is a block diagram of a power supply system according to an embodiment of the present invention.

There will be detailed below the preferred embodiments of the present invention, with reference to the accompanying drawings. Like elements are designated by like reference characters.

FIG. 1 shows a power supply system S1 according to a first embodiment of the invention. The power supply system S1 serves for a grounded load 13, and includes a 12-V power supply 11, a 36-V power supply 17 having a high supply voltage Vs, a switching n-channel MOSFET (metal oxide semiconductor field-effect transistor) 15 interconnected between the power supply 11 and the load 13, and a driving simple ON/OFF circuit 19 connected between the 36-V power supply 17 and the MOSFET 15. The ON/OFF circuit 19 works with power supplied from the 36-V power supply. The MOSFET 15 is provided as a depression type FET having a substrate electrode G' internally connected to a gate G, but it may be an enhancement type.

In the power supply system S1, high and low different voltages from the 12-V and 36-V power supplies 11 and 17 are employed such that a 12-V voltage output from the 12-V power supply 11 is distributed via the n-channel MOSFET 15, where the gate G receives an on-off drive signal Sd from the ON/OFF circuit 19, which functions with power supplied therefor from the 36-V power supply 17 and with an ON/OFF control signal Sc input thereto from a control signal generating circuit Ct, whereby the supply of electrical power to the load 13 is controlled.

In the system S1, electric power from the 12-V power supply 11 is supplied to the load 13 through a drain D and a source S of the n-channel MOSFET 15, which serves as a semiconductor switch. In the MOSFET 15, the drain D has a drain voltage $V_{DS}$ relative to the source S, and the gate G has a gate voltage $V_{GS}$ relative to the source S. The load 13 comprises an apparatus or appliance such as a tail lamp or head lamp, that functions with electric power input thereto when the MOSFET 15 is switched on with the drive signal Sd from the ON/OFF circuit 19.

The simple ON/OFF circuit 19 includes a zener diode ZD connected between the gate G and the source S of the n-channel MOSFET 15. The zener diode ZD acts as a one-way diode for gate voltages $V_{GS}$ not exceeding a specified zenor voltage, and as a bypass for any excessive voltage $V_{GS}$ that might occur between the gate G and the source S, and holds the gate voltage $V_{GS}$ to approximately 10 V. The zener voltage is sufficiently small relative a permissible maximum gate voltage $V_{GS}$ specified for the MOSFET 15.

The simple ON/OFF circuit 19, which functions as a switching drive, includes at the input end an input transistor Q2, which has an emitter E connected to a grounded conductor, a collector C connected to one end of an input resistor R2, and a base B for receiving the ON/OFF control signal Sc input thereto for switching the transistor Q2 on and off. The ON/OFF circuit 19 has at the output end an output transistor Q1, which is connected at a base B thereof to the other end of the input resistor R2, at an emitter E thereof to an output terminal of the 36-V power supply 17, and at a collector C thereof to one end of an output resistor R1. This transistor Q1 is switched on and off in accordance with a switching of that transistor Q2, whereby the supply voltage Vs from the 36-V power supply 17 is imposed via the resistor R1 to the gate G of the n-channel MOSFET 15.

In the power supply system S1, therefore, the simple ON/OFF circuit 19 provides a switching-controlling drive signal Sd to the n-channel MOSFET 15. The MOSFET 15 may be replaced with a thermal FET adapted to function for thermal protection.

Actions of the power supply system S1 will be described below.

First, for example, when the control signal Sc having an on state (hereafter sometimes called "ON signal") is input to the base B of the input transistor Q2, it causes this transistor Q2 to switch on, which in turn causes the output transistor Q1 to be switched on.

As a result, a 36-V voltage supplied from the power supply 17 is imposed on the gate G of the n-channel MOSFET 15, via the output resistor R1. The imposed voltage on the gate G is sufficiently higher than the 12-V supply voltage for the load 13, and turns the n-channel MOSFET 15 on, allowing the 12-V supply voltage to be distributed to the load 13.

The power supply system S1 may preferably be applied to a multi-voltage system, such as one having a 12-V subsystem and a 36-V subsystem in a vehicle, as the 36-V power supply 17 is used to perform on/off control of the voltage $V_{GS}$ between the gate G and the source S of the n-channel MOSFET 15 and the supply voltage from the conventionally used 12-V power supply 11 is distributed to the load 13 in an on-off controllable manner. In the application, it may well facilitated to achieve on/off control of 12-V supply, without the need for a complex charge pump circuit (109) as used in the past. There can be used a simple, low-cost circuit configuration.

In performing simple on/off control using the ON/OFF circuit 19, static operation is possible without the need for an oscillator circuit (113) to be employed for a charge pump circuit (109), thereby almost completely eliminating problems such as radio noise.

Additionally, because of an extremely low output impedance of the 36-V power supply 17, it is possible to perform high-speed on/off control using the simple ON/OFF circuit 19, for example, PWM control, in which the duty ratio between on and off times is controlled. The PWM control can be used, for example, to adjust the brightness of the load 13, or to perform linear control of a motor.

The above-noted two power supplies may preferably be installed in an electrical distribution box (junction box) of a vehicle, permitting an extremely easy and compact power supply system to be implemented.

Additionally, while mechanical relays such as ISO relays and microrelays are used internally at present, by using the MOSFET 15 or a thermal FET with built-in thermal protection provided in the power supply system S1, it is possible to implement a contactless relay that does not require maintenance. Another advantage of using a thermal FET having built-in thermal protection is that it eliminates the need to provide such separate elements as fuses.

Figure 2:
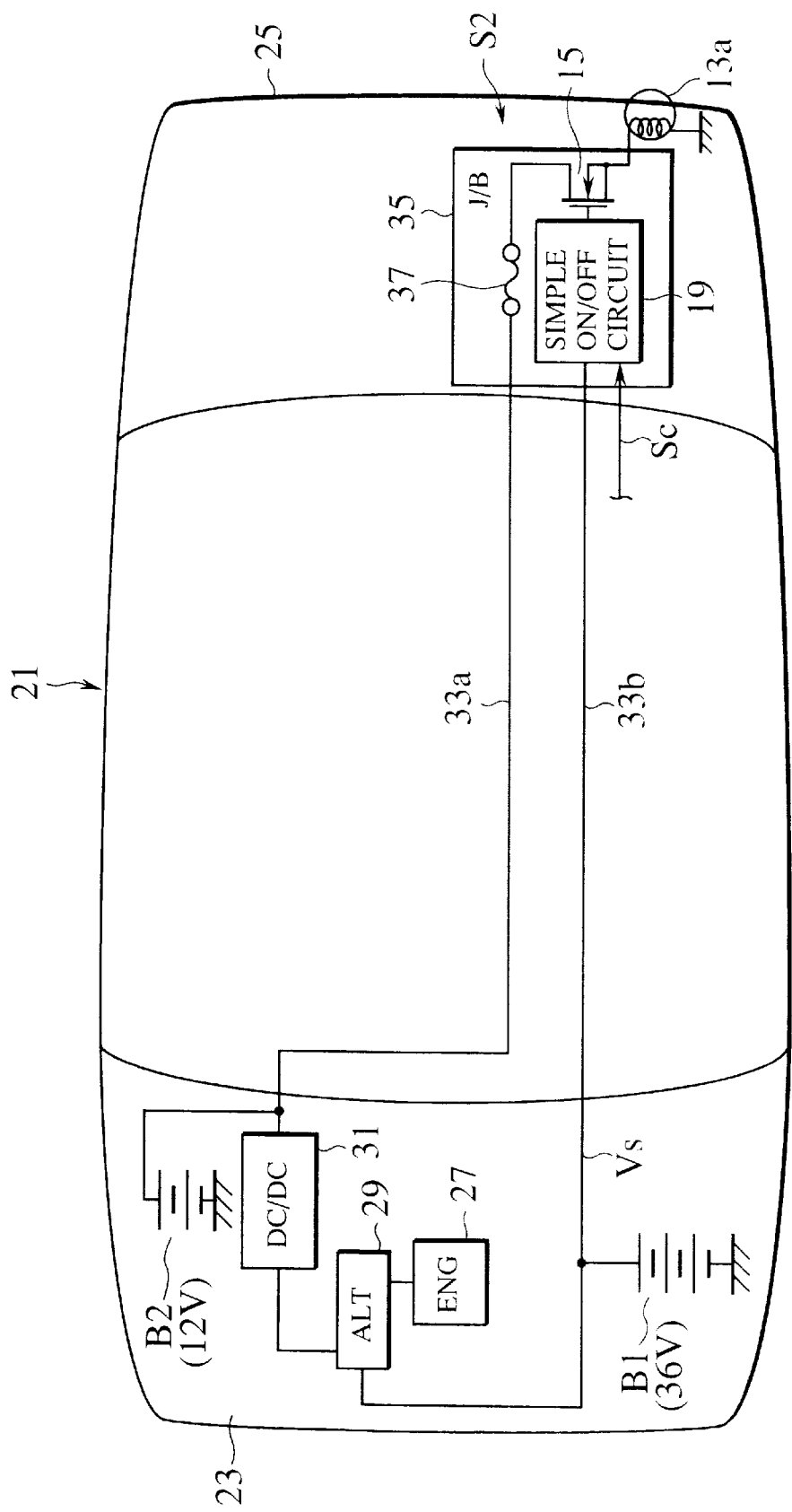
FIG. 2 is a schematic plan of a vehicle equipped with a power supply system according to another embodiment of the present invention.

FIG. 2 shows a power supply system S2 mounted in a vehicle 21 according to a second embodiment of the invention.

The vehicle 21 has disposed in a front part 23 thereof an engine 27, an alternator 29, which generates an AC voltage in response to drive power received from the engine 27, a DC/DC converter 31 that converts a voltage (for example, 42 V) generated by the alternator 29 to a DC 14 V, a 36-V battery B1 (corresponding to the 36-V power supply 17 in the previous embodiment S1) having a high supply voltage Vs, and a 12-V battery B2 (corresponding to the 12-V power supply 11 in the previous embodiment S1).

In a rear part 25 of the vehicle 21 there are disposed a junction box 35, which is supplied with a voltage from the 12-V battery B2 via a power cable 33a and a voltage from the 36-V battery B1 via a power cable 33b, and tail lamps 13a as a load. The junction box 35 contains a simple ON/OFF circuit 19, to which is supplied a voltage from the 36-V battery B1, and an n-channel MOSFET 15, to which is supplied a voltage from the 12-V battery B2 via a fuse 37. The ON/OFF circuit 19 is controlled with a control signal Sc input thereto from a control signal generating circuit.

The power supply system S2 comprises an entirety of the junction box 35, power supplies B1, B2 (with connected elements 27, 29, 31 inclusive) and associated wiring harness (with cables 33a, 33b and a signal line inclusive), and serves as a simple, low-cost, and effectively compact system.

Figure 3:
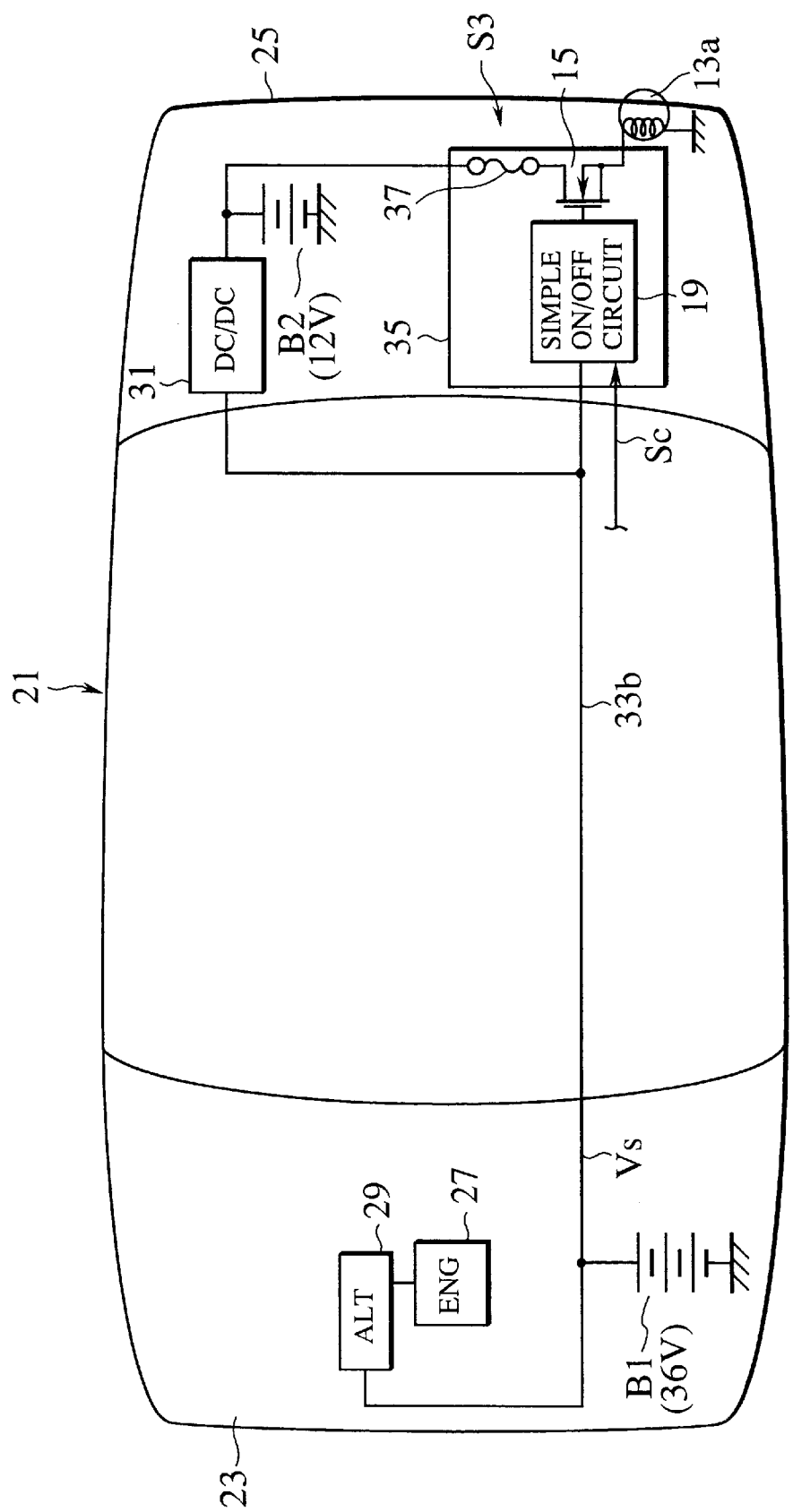
FIG. 3 is a schematic plan of a vehicle equipped with a power supply system according to another embodiment of the present invention.

FIG. 3 shows a power supply system S3 mounted in a vehicle 21 according to a third embodiment of the invention. As distinctive arrangement to the previous embodiment S2, the power supply system S3 has a DC/DC converter 31 and a 12-V battery B2 both disposed in a rear part 25 of the vehicle 21.

In addition to achieving effects of the previous embodiment S2, the embodiment S3 of FIG. 3 has another advantage such that as a 36-V battery B1 remains in a front part 23 of the vehicle 21, an effective weight balancing is achieved in the vehicle 21 in which the 12-V battery B2 is installed in the rear part 25.

Figure 4:
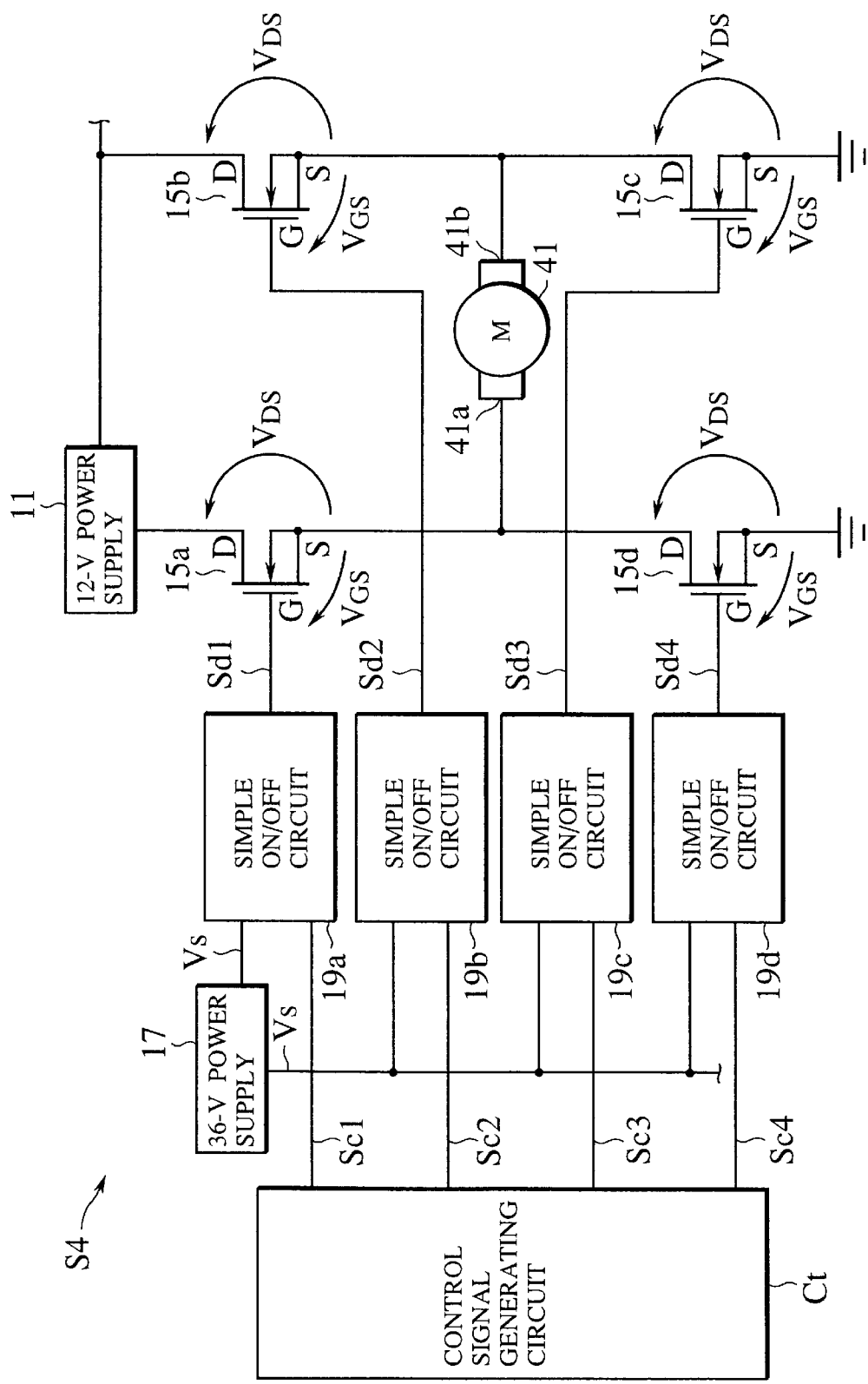
FIG. 4 is a block diagram of a power supply system according to another embodiment of the present invention.

FIG. 4 shows a power supply system S4 mounted in a vehicle (21 of FIG. 2 or 3) according to a fourth embodiment of the present invention that is applied to drive a DC servo motor 41 which constitutes a power window system that moves a window glass of the vehicle up and down, requiring it to be driven in both forward and reverse directions.

The power supply system S4 has a first n-channel MOSFET 15a connected between a 12-V power supply 11 and a first external control electrode 41a of the motor 41 with a positive polarity, a second n-channel MOSFET 15b connected between the 12-V power supply 11 and a second external control electrode 41b of the motor 41 with a negative polarity, a third n-channel MOSFET 15c connected between the second electrode 41b of the motor 41 and a grounded conductor, and a fourth n-channel MOSFET 15d connected between the first electrode 41a of the motor 41 and a grounded conductor. The 12-V power supply 11 is common to the four n-channel MOSFETs 15a to 15d, but may be separately provided for their individual use.

The power supply system S4 further includes a common 36-V power supply 17 which has a sufficiently high supply voltage Vs for use to drive any of the MOSFETs 15a to 15d, a first simple ON/OFF circuit 19a connected between the 36-V power supply 17 and the first n-channel MOSFET 15a, a second simple ON/OFF circuit 19b connected between the 36-V power supply 17 and the second n-channel MOSFET 15b, a third simple ON/OFF circuit 19c connected between the 36-V power supply 17 and the third n-channel MOSFET 15c, a fourth simple ON/OFF circuit 19d connected between the 36-V power supply 17 and the fourth n-channel MOSFET 15d, and a control signal generating circuit Ct provided in a power window controller and connected in parallel to the first to fourth ON/OFF circuits 19a to 19d. The 36-V power supply 17 is common to the four simple ON/OFF circuits 19a to 19d, but may be separately provided for their individual use.

The control signal generating circuit Ct provides the four simple ON/OFF circuits 19a to 19d with four synchronized motor control signals: a first control signal Sc1 for controlling the first ON/OFF circuit 19a to output therefrom a high-voltage drive signal Sd1 to a gate G of the first n-channel MOSFET 15a to be thereby switched on and off, a second control signal Sc2 for controlling the second ON/OFF circuit 19b to output therefrom a high-voltage drive signal Sd2 to a gate G of the second n-channel MOSFET 15b to be thereby switched on and off, a third control signal Sc3 cooperating with the first control signal Sc1 for controlling the third ON/OFF circuit 19c to output therefrom a drive signal Sd3 to a gate G of the third n-channel MOSFET 15c to be thereby switched on and off in synchronism with the first MOSFET 15a, and a fourth control signal Sc4 cooperating with the second control signal Sc2 for controlling the fourth ON/OFF circuit 19d to output therefrom a drive signal Sd4 to a gate G of the fourth n-channel MOSFET 15d to be thereby switched on and off in synchronism with the second MOSFET 15a. The third and fourth ON/OFF circuits 19c and 19d may preferably be connected to a lower-voltage power supply employed in place of the 36-V power supply 17.

In the power supply system S4, at a timing when the first MOSFET 15a is driven to switch on, then the third MOSFET 15c also is switched on, so that a forward current is conducted from the 12-V power supply 11 to the ground, via the first MOSFET 15a, the positive polarity electrode 41a of the motor 41, the negative polarity electrode 41b of the motor 41, and the third MOSFET 15c in this order, thereby causing a rotor of the motor 41 to rotate in a forward direction.

Likewise, at another timing when the second MOSFET 15b is driven to switch on, then the fourth MOSFET 15d also is switched on, so that a reverse current is conducted from the 12-V power supply 11 to the ground, via the second MOSFET 15b, the negative polarity electrode 41b of the motor 41, the positive polarity electrode 41a of the motor 41, and the fourth MOSFET 15d in this order, thereby causing the rotor of the motor 41 to rotate in a reverse direction.

Thus, it is possible to achieve a low-cost power supply system having a simple circuit configuration, without using a complex charge pump circuit (109), enabling easy drive of the motor 41 in both forward and reverse directions. It is possible as well to use a thermal FET as the FETs in the power supply system S4.

Figure 5:
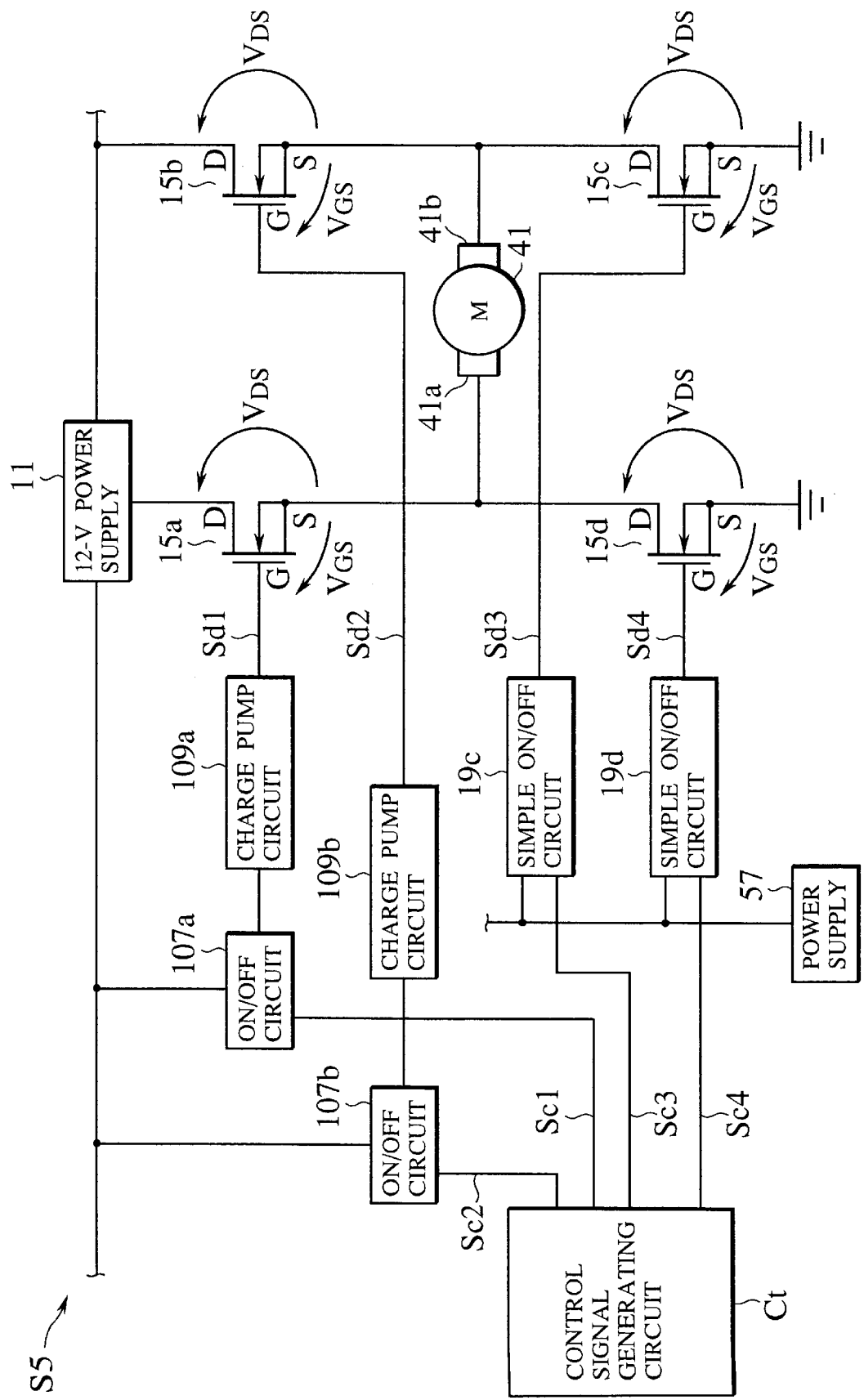
FIG. 5 is a block diagram of a hybrid power supply system according to another embodiment of the invention, as a modification of the power supply system of FIG. 4.

FIG. 5 shows a hybrid power supply system S5 mounted in a vehicle (21 of FIG. 2 or 3) according to a fifth embodiment of the invention, as a partial modification of the power supply system S4.

In this hybrid power supply system S5, at the high side of a motor 41 therein, the first and second simple ON/OFF circuits 19a and 19b of the previous system S4 is substituted by a combination of a first ON/OFF circuit 107a, which receives a first control signal Sc1 from a control signal generating circuit Ct and a supply voltage from a 12-V power supply 11, and a first charge pump circuit 109a, which is cooperative with the first ON/OFF circuit 107a to provide a first drive signal Sd1 to a gate G of a first n-channel MOSFET 15a in accordance with the first control signal Sc1, and a combination of a second ON/OFF circuit 107b, which receives a second control signal Sc2 from the control signal generating circuit Ct and the supply voltage from the 12-V power supply 11, and a second charge pump circuit 109b, which is cooperative with the second ON/OFF circuit 107b to provide a second drive signal Sd2 to a gate G of a second n-channel MOSFET 15b in accordance with the second control signal Sc2, respectively, to permit an effect-mixing sophisticate control at the described costs.

At the grounded side of the motor 41, this system S5 has an identical arrangement to the system S4, while a lower-voltage power supply 57 is employed therefor. This power supply 57 has a supply voltage between 12V and 36V, but may be replaced with a 36-V power supply.

Figure 6:
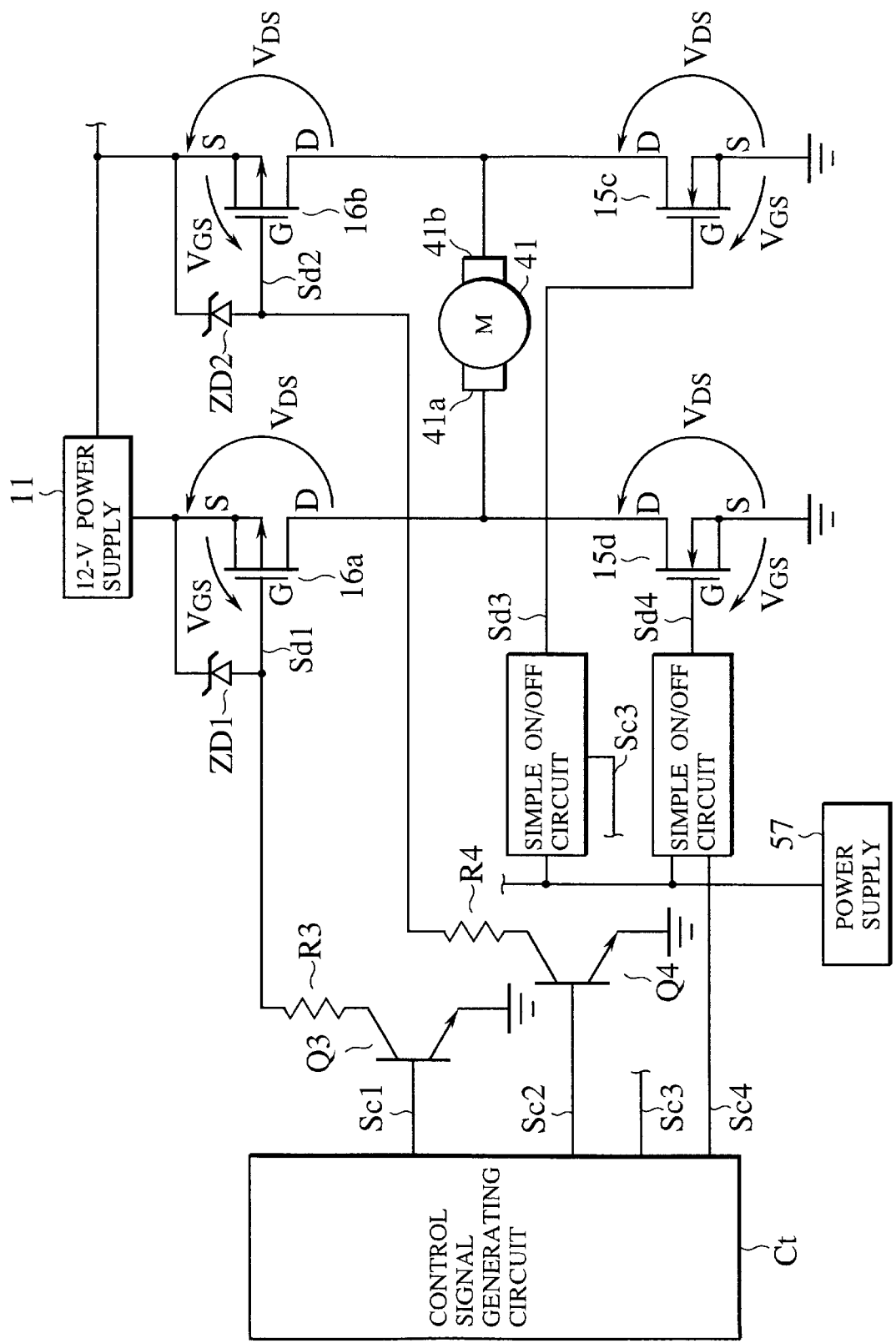
FIG. 6 is a block diagram of a power supply system according to another embodiment of the present invention, as another modification of the power supply system of FIG. 4.
Figure 7:
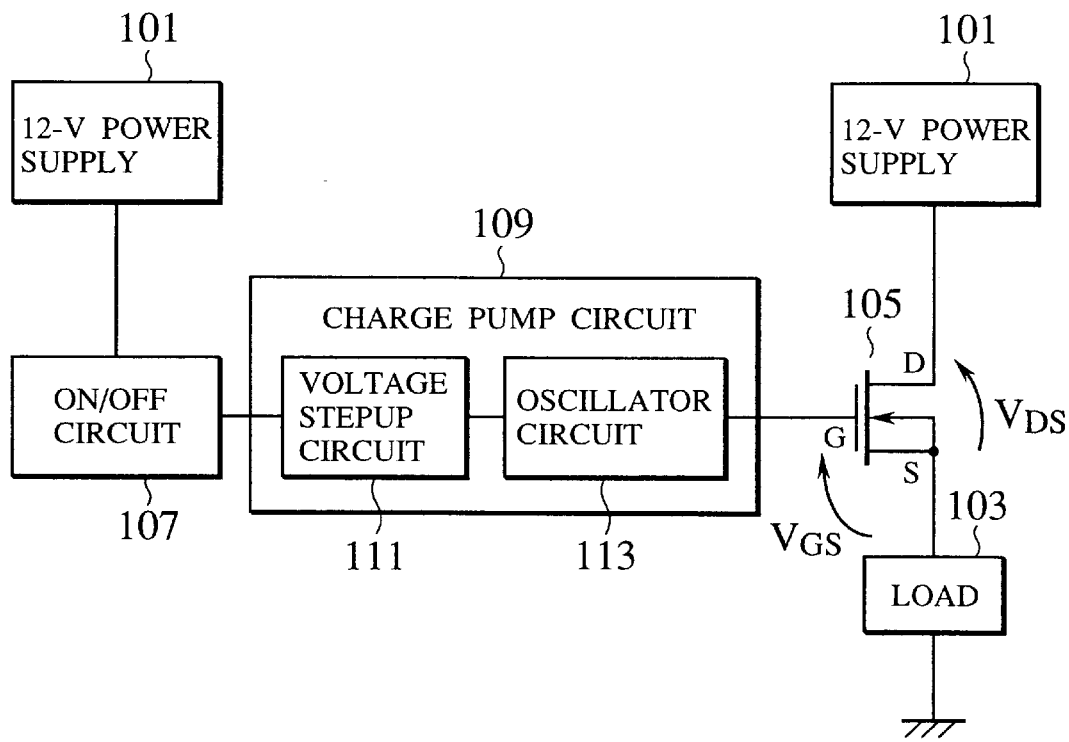
FIG. 7 is a block diagram originally prepared to show a comprehensive example of a power supply system including conventional components.
Figure 8:
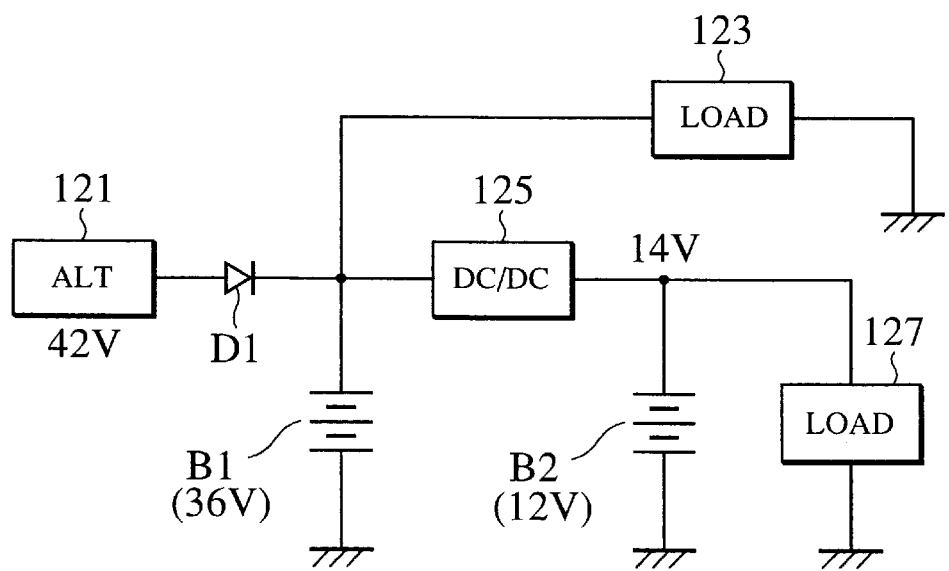
FIG. 8 is a block diagram originally prepared to show another comprehensive example of a power supply system including conventional components.

FIG. 6 shows a power supply system S6 mounted in a vehicle (21 of FIG. 2 or 3) according to a sixth embodiment of the invention, as another partial modification of the power supply system S4.

This power supply system S6 employs, in place of the first n-channel MOSFET 15a of the system S4, a first p-channel MOSFET 16a which is connected between a 12-V power supply 11 and a positive-polarity electrode 41a of a motor 41, and in place of the second n-channel MOSFET 15b of the system S4, a second p-channel MOSFET 16b which is connected between the 12-V power supply 11 and a negative-polarity electrode 41b of the motor 41.

In the power supply system S6, at the high side of the motor 41, the first and second simple ON/OFF circuits 19a and 19b of the system S4 is substituted by a combination of a first zener diode ZD1, which is connected between a source S and a gate G of the first p-channel MOSFET 16a, and a first transistor Q3, which is connected between the gate G of the MOSFET 16a and a grounded conductor and receives a first control signal Sc1 from a control signal generating circuit Ct, and a combination of a second zener diode ZD2, which is connected between a source S and a gate G of the second p-channel MOSFET 16b, and a second transistor Q4, which is connected between the gate G of the MOSFET 16b and a grounded conductor and receives a second control signal Sc1 from the control signal generating circuit Ct, respectively, to permit a sophisticate control at a described cost. The first and second transistors Q3 and Q4 are provided with output resistors R3 and R4, respectively. At the grounded side of the motor 41, this system S6 has an identical arrangement to the system S4, while a lower-voltage power supply 57 is employed therefor. This power supply 57 may also be changed to a 36-V power supply.

As the first control signal Sc1 turns on, the first transistor Q3 is caused to switch on, conducting a bypassed current through the first zener diode ZD1, and provides a first drive signal Sd1 to the gate G of the first p-channel MOSFET 16a in accordance with the control signal Sc1. Likewise, with the second control signal Sc2 on, the second transistor Q3 is switched on, conducting a bypassed current through the second zener diode ZD2, and provides a second drive signal Sd2 to the gate G of the second p-channel MOSFET 16b in accordance with the control signal Sc2.

The system S6 uses both n-channel and p-channel MOSFETs, and is adapted to drive the motor 41 in forward and reverse directions.

In the embodiments described, it is alternately possible to use, for example, a 24-V power supply for on/off control of n-channel MOSFET.

As will be seen from the foregoing description, according to (an) embodiment(s) of the invention, a semiconductor switch is implemented by using an n-channel MOSFET, which is used to perform (FIGS. 1–4) or cooperatingly effect (FIGS. 4–6) on/off control of the supply of a lower supply voltage to a load.

A high-voltage power supply (B1) is disposed in a front part (23) of a vehicle (FIG. 2), and a semiconductor switch (15) is disposed in a rear part (25) of the vehicle, thereby achieving a reduction in weight of wiring harness.

A low-voltage power supply (B2) is disposed at a rear part (25) of a vehicle (FIG. 3), and a high-voltage power supply (B1) is disposed in a front part (23) of the vehicle, thereby achieving a balance of weight in the vehicle.

A power supply system (FIG. 4) has a first semiconductor switch (15a) connected to a first power supply (11) and to one end, (41a) of a motor (41), a second semiconductor switch (15c, a third in the embodiment) connected to the other end (41b) of the motor and to ground, a third semiconductor switch (15b, a second in the embodiment) connected to the first power supply (11) and to the other end (41b) of the motor, a fourth semiconductor switch (15d) connected to the one end (41a) of the motor and to ground, a second power supply (17) having a second voltage (36V), larger than a first voltage (12V) of the first power supply and capable of on/off controlling the first and third semiconductor switches (15a, 15b), a first driving means (19a) for outputting to a control input terminal (G) of the first semiconductor switch (15a) a signal (Sd1) for performing on/off control of the first semiconductor switch (15a) by means of the second voltage (36V), a second driving means (19c, a third in the embodiment) for performing on/off control of the second semiconductor switch (15c) linked to on/off control of the first semiconductor switch (15a), a third driving means (19b, a second in the embodiment) for outputting to a control input terminal (G) of the third semiconductor switch (15b) a signal (Sd2) for performing on/off control of the third semiconductor switch (15b) by means of the second voltage (36V), and a fourth driving means (19d) for performing on/off control of the fourth semiconductor switch (15d) linked to on/off control of the third semiconductor switch (15b).

Accordingly, by using the second power supply voltage (36V) to turn on the first semiconductor switch (15a) using the first driving means (19a), and then turning the second semiconductor switch (15c) on in concert with turning on the first semiconductor switch (15a), current flows from the first power supply (11) to the first semiconductor switch (15a), the motor (41), the second semiconductor switch (15c) and to ground, thereby causing the motor (41) to rotate in a forward direction, for example. In the same manner, by using the second power supply voltage (36V) to turn on the third semiconductor switch (15b) using the third driving means (19c), and then turning the fourth semiconductor switch (15d) on in concert with turning on the third semiconductor switch (15b), current flows from the first power supply (11) to the third semiconductor switch (15b), the motor (41), the fourth semiconductor switch (15d) and to ground, thereby causing the motor (41) to rotate in a reverse direction, for example.

Thus, it is possible to achieve a power supply system (S4) which facilitates the forward/reverse drive of a motor, with a simple, low-cost circuit configuration, and without the need for a charge pump circuit. By virtue of the configuration (S4), there is provided a power supply system enabling easy drive of a motor in both forward and reverse directions.

The first and third semiconductor switches (15a, 15b) are implemented using an n-channel MOSFETs, which are used to perform on/off control of the supply of first supply voltage (11V).

A second power supply (36V) is used to perform on/off control of a semiconductor switch (15) and an output voltage (12V) from a first power supply (11) is supplied to a load (13) so as to control the supply of electrical power to the load. This configuration (S1) eliminates the need to provide a complex charge pump circuit such as used in the past, while enabling extremely easy on/off control of a load, using a simple, low-cost circuit configuration.

The use of an n-channel MOSFET (15) as the semiconductor switch enables on/off control of the first power supply (11) by a n-channel MOSFET.

While preferred embodiments of power supply systems and methods according to the present invention have been described using specific terms, such description is for illustrative purposes, and it is to be understood that changes and variations may be made without departing from the spirit or scope of the following claims.

What is claimed is:

1. A power supply system comprising:
   a first power supply having a first supply voltage;
   a second power supply having a second supply voltage larger than the first supply voltage;
   a semiconductor switch drivable with the second supply voltage and connected between the first power supply and a load; and
   a drive circuit using the second supply voltage to produce an on-off drive signal to drive the semiconductor switch, wherein
      the semiconductor switch comprises an n-channel field-effect transistor having a drain connect to the first power supply, a source connected to the load, and a gate connected to the drive circuit.

2. The power supply system of claim 1, wherein the drive circuit comprises a switching circuit connected between the second power supply and the semiconductor switch.

3. The power supply system of claim 2, wherein the semiconductor switch further comprises a zener diode connected between the, source and the gate of the n-channel field-effect transistor.

4. The power supply system of claim 2, wherein the switching circuit comprises a first transistor having an emitter connected to the second power supply and collector connected to the gate of the n-channel field-effect transistor.

5. The power supply system of claim 4, wherein the switching circuit further comprises a second transistor having a collector connected to a base of the first transistor, an emitter connected to a ground, and a base to receive a switching control signal.

6. A power supply system for a vehicle including a load, the power supply system comprising:
   a first power supply having a first supply voltage;
   a second power supply having a second supply voltage larger than the first supply voltage;
   a semiconductor switch drivable with the second supply voltage and connected between the first power supply and the load; and
   a drive circuit using the second supply voltage to produce an on-off drive signal to drive the semiconductor switch, wherein
      the load comprises a tail lamp of the vehicle, and
      the second power supply comprises a battery installed in a front part of the vehicle.

7. The power supply system of claim 6, wherein the first power supply comprises a battery installed in a rear part of the vehicle.

8. A power supply system for a vehicle including a motor having first and second electrodes different of polarity, and grounding circuitry, the power supply system comprising:
   a first power supply having a first supply voltage;
   a second power supply having a second supply voltage larger than the first supply voltage;
   a first semiconductor switch connected between the first power supply and the first electrode of the motor;
   a second semiconductor switch connected between the first power supply and the second electrode of the motor;
   a third semiconductor switch drivable with the second supply voltage and connected between the second electrode of the motor and the grounding circuitry;
   a fourth semiconductor switch drivable with the second supply voltage and connected between the first electrode of the motor and the grounding circuitry;
   a first drive circuit configured to drive the first semiconductor switch;
   a second drive circuit configured to drive the second semiconductor switch;
   a third drive circuit using the second supply voltage as a drive signal to drive the third semiconductor switch;
   a fourth drive circuit using the second supply voltage as a drive signal to drive the fourth semiconductor switch; and
   a controller configured to synchronously control the first, second, third and fourth drive circuits to control a rotating direction of the motor.

9. The power supply system of claim 8,
   wherein the first semiconductor switch comprises a first n-channel field-effect transistor having a drain connected to the first power supply and a source connected to the first electrode of the motor, and the second semiconductor switch comprises a second n-channel field-effect transistor having a drain connected to the first power supply and a source connected to the second electrode of the motor, and
   wherein the first drive circuit comprises a first switching circuit powered from the first power supply and controlled from the controller and a first charge pump circuit connected between the first switching circuit and a gate of the first n-channel field-effect transistor, and the second drive circuit comprises a second switching circuit powered from the first power supply and controlled from the controller and a second charge pump circuit connected between the second switching circuit and a gate of the second n-channel field-effect transistor.

10. The power supply system of claim 8,
   wherein the first semiconductor switch comprises a first p-channel field-effect transistor having a source connected to the first power supply and a drain connected to the first electrode of the motor, and the second semiconductor switch comprises a second p-channel field-effect transistor having a source connected to the first power supply and a drain connected to the second electrode of the motor, and
   wherein the first drive circuit comprises a first zener diode connected between a gate and the source of the first p-channel field-effect transistor and a first switching transistor connected between the gate of the first p-channel field-effect transistor and the grounding circuitry and controlled from the controller, and the second drive circuit comprises a second zener diode connected between a gate and the source of the second p-channel field-effect transistor and a second switching transistor connected between the gate of the second p-channel field-effect transistor and the grounding circuitry and controlled from the controller.

11. A power supply system in which on/off control of a semiconductor switch is performed to control supply of electrical power from a first power supply to a load, comprising:

a second power supply with a second voltage larger than a first voltage of the first power supply; and a driver outputting to a control input terminal of the semiconductor switch an on/off control signal for performing on/off control of the semiconductor switch, wherein the driver uses the second voltage supplied from the second power supply to produce the on/off control signal, wherein the second power supply comprises a battery installed in a front part of a vehicle.

12. A power supply system comprising:

a first semiconductor switch connected to a first power supply and to a first end of a motor;

a second semiconductor switch connected to a second end of the motor and to ground;

a third semiconductor switch connected to the first power supply and to the second end of the motor;

a fourth semiconductor switch connected to the first end of the motor and to ground;

a second power supply having a second voltage, larger than a first voltage of the first power supply and capable of on/off controlling the first and third semiconductor switches;

a first driver outputting to a control input terminal of the first semiconductor switch a signal for performing on/off control of the first semiconductor switch by means of the second voltage;

a second driver performing on/off control of the second semiconductor switch linked to on/off control of the first semiconductor switch;

a third driver outputting to a control input terminal of the third semiconductor switch a signal for performing on/off control of the third semiconductor switch by means of the second voltage; and a fourth driver performing on/off control of the fourth semiconductor switch linked to on/off control of the third semiconductor switch.

13. A power supply method comprising:

providing a first power supply having a first supply voltage;

providing a second supply voltage larger than the first supply voltage;

connecting an n-channel field-effect transistor between the first power supply and a load, as a semiconductor switch drivable with the second supply voltage, having
a drain thereof connected to the first power supply,
a source thereof connected to the load, and
a gate thereof connected to the drive circuit; and generating a drive signal to drive the semiconductor switch using the second supply voltage.

14. A power supply method for a vehicle including a tail lamp as a load, the power supply method comprising:

providing a first power supply having a first supply voltage;

providing a battery in a front part of the vehicle, as a second power supply having a second supply voltage larger than the first supply voltage;

connecting a semiconductor switch between the first power supply and the load, the semiconductor switch being drivable with the second supply voltage; and generating a drive signal to drive the semiconductor switch using the second supply voltage.

15. A method for supplying electrical power from a first power supply to a load by performing on/off control of a semiconductor switch, the method comprising:

supplying to a driver from a second power supply a second voltage larger than a first voltage from the first power supply and capable of on/off controlling the semiconductor switch; and outputting to a control input terminal of the semiconductor switch an on/off control signal for on/off controlling the semiconductor switch, the on/off control signal being produced using the second voltage supplied to the driver from the second power supply, wherein the second power supply comprises a battery installed in a front part of a vehicle.

16. A power supply system comprising:

a first power supply outputting a first supply voltage to operate a low-voltage load;

a second power supply outputting a second supply voltage greater than the first supply voltage, to operate a high-voltage load;

a semiconductor switch connected between the first power supply and the low-voltage load; and a drive circuit configured to drive the semiconductor switch, wherein the semiconductor switch comprises a field-effect transistor having a drain thereof connected to the first power supply, and a source thereof connected to the low-voltage load, the field-effect transistor being drivable with the second supply voltage, and the drive circuit comprises
a switching circuit connected to the second power supply,
an output resistor connected between the switching circuit and a gate of the field-effect transistor, and
a Zener diode connected between the output resistor and the source of the field-effect transistor.

17. A power supply system according to claim 16, wherein the field-effect transistor is an n-channel type.

18. A power supply system according to claim 16, wherein the switching circuit comprises a first transistor having an emitter thereof connected to the second power supply, and a collector thereof connected to the gate of the field-effect transistor.

19. A power supply system according to claim 18, wherein the switching circuit further comprises a second transistor having a collector thereof connected to a base of the first transistor, an emitter thereof grounded, and a base thereof configured to receive a switching control signal.

20. A power supply system for vehicles including a low-voltage load and a high-voltage load, the power supply system comprising:

a first power supply outputting a first supply voltage to operate the low-voltage load;

a second power supply outputting a second supply voltage greater than the first supply voltage, to operate the high-voltage load;

a semiconductor switch connected between the first power supply and the low-voltage load; and a drive circuit configured to drive the semiconductor switch, wherein the semiconductor switch comprises a field-effect transistor having a drain thereof connected to the first power supply, and a source thereof connected to the low-voltage load, the field-effect transistor being drivable with the second supply voltage; and the drive circuit comprises a switching circuit connected to the second power supply, an output resistor connected between the switching circuit and a gate of the field-effect transistor, and a Zener diode connected between the output resistor and the source of the field-effect transistor.

21. A power supply system for vehicles according to claim 20, wherein the low-voltage load comprises a tail lamp of a vehicle, the first power supply comprises a battery installed in a rear part of the vehicle, and the second power supply comprises a battery installed in a front part of the vehicle.

22. A power supply system for vehicles including a low-voltage load provided with a motor having a first and a second electrode mutually different in polarity, a high-voltage load, and grounded circuitry, the power supply system comprising:

a first power supply outputting a first supply voltage to operate the low-voltage load;

a second power supply outputting a second supply voltage greater than the first supply voltage, to operate the high-voltage load;

a first semiconductor switch connected between the first electrode of the motor and the grounded circuitry;

a second semiconductor switch connected between the second electrode of the motor and the grounded circuitry;

a third semiconductor switch connected between the first power supply and the first electrode of the motor;

a fourth semiconductor switch connected between the first power supply and the second electrode of the motor;

a first drive circuit configured to drive the first semiconductor switch;

a second drive circuit configured to drive the second semiconductor switch;

a third drive circuit configured to drive the third semiconductor switch;

a fourth drive circuit configured to drive the fourth semiconductor switch; and a controller configured for synchronous control of the first, the second, the third, and the fourth drive circuit to control a rotational direction of the motor, wherein one of the first and the second semiconductor switch comprises a first n-channel field-effect transistor having a drain thereof connected to the first power supply, and a source thereof connected to one of the first and the second electrode of the motor, the first n-channel field-effect transistor being drivable with the second supply voltage, and one of the first and the second drive circuit comprises a first switching circuit connected to the second power supply, a first output resistor connected between the first switching circuit and a gate of the first n-channel field-effect transistor, and a first Zener diode connected between the first output resistor and the source of the first n-channel field-effect transistor.

23. A power supply system for vehicles according to claim 22, wherein one of the third and the fourth semiconductor switch comprises a second n-channel field-effect transistor having a drain thereof connected to the first power supply, and a source thereof connected to one of the first and the second electrode of the motor, and one of the third and the fourth drive circuit comprises a second switching circuit powered from the first power supply and controlled from the controller, and a charge pump circuit connected between the second switching circuit and a gate of the second n-channel field-effect transistor.

24. A power supply system for vehicles according to claim 22, wherein one of the third and the fourth semiconductor switch comprises a p-channel field-effect transistor having a source thereof connected to the first power supply, and a drain thereof connected to one of the first and the second electrode of the motor, and one of the third and the fourth drive circuit comprises a second Zener diode connected between the source and a gate of the p-channel field-effect transistor, and a switching transistor connected between the gate of the p-channel field-effect transistor and the grounded circuitry and controlled from the controller.

25. A power supply system for vehicles including:

a first power supply line supplying power of a low voltage to a low-voltage load;

a second power supply line supplying power of a high voltage to a high-voltage load;

a semiconductor switch installed in the first power supply line; and a drive circuit configured to drive the semiconductor switch, wherein the semiconductor switch comprises a field-effect transistor having a drain thereof connected to the first power supply line, and a source thereof connected to the low-voltage load, the field-effect transistor being drivable with the high voltage, and the drive circuit comprises a switching circuit connected to the second power supply line, an output resistor connected between the switching circuit and a gate of the field-effect transistor, and a Zener diode connected between the output resistor and the source of the field-effect transistor.

26. A power supply method including:

providing a first voltage to operate a low-voltage load;

supplying the first voltage to the low-voltage load through a semiconductor switch; and on-off controlling the semiconductor switch, wherein the power supply method comprises:

having the semiconductor switch configured with a field-effect transistor drivable with a second voltage greater than the first voltage;

connecting a source of the field-effect transistor to the low-voltage load;

supplying the first voltage to a drain of the field-effect transistor;

supplying the second voltage to a gate of the field-effect transistor through a switching circuit and an output resistor;

connecting a Zener diode between the output resistor and the source of the field-effect transistor; and on-off controlling the switching circuit.

27. A power supply method for vehicles including a low-voltage load and a high-voltage load, the power supply method comprising:

providing a first voltage to operate the low-voltage load;

providing a second voltage greater than the first voltage, to operate the high-voltage load;

providing a field-effect transistor on-off drivable with the second voltage;

connecting a source of the field-effect transistor to the low-voltage load;

supplying the first voltage to a drain of the field-effect transistor;

supplying the second voltage to a gate of the field-effect transistor through a switching circuit and an output resistor;

connecting a Zener diode between the output resistor and the source of the field-effect transistor; and on-off controlling the switching circuit.

* * * * *

UNITED STATES PATENT AND TRADEMARK OFFICE
CERTIFICATE OF CORRECTION

PATENT NO.     : 6,548,916 B1
DATED          : April 15, 2003
INVENTOR(S)    : Akiyoshi Kanazawa and Makoto Uda It is certified that error appears in the above-identified patent and that said Letters Patent is hereby corrected as shown below:

<u>Column 11,</u>
Line 46, after "between the" , delete the comma.

Signed and Sealed this

Fourth Day of November, 2003

JAMES E. ROGAN
*Director of the United States Patent and Trademark Office*